(12) United States Patent
Wentroble et al.

(10) Patent No.: US 8,767,762 B2
(45) Date of Patent: Jul. 1, 2014

(54) PHYSICAL TRANSCEIVER GEARBOX

(75) Inventors: Mark E. Wentroble, Plano, TX (US); T-Pinn R. Koh, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 56 days.

(21) Appl. No.: 13/531,369

(22) Filed: Jun. 22, 2012

(65) Prior Publication Data
US 2013/0343439 A1 Dec. 26, 2013

(51) Int. Cl.
*H04J 3/06* (2006.01)
(52) U.S. Cl.
USPC .................. 370/419; 370/463; 370/503
(58) Field of Classification Search
None
See application file for complete search history.

(56) References Cited

U.S. PATENT DOCUMENTS

| | | | |
|---|---|---|---|
| 7,499,500 B2 | 3/2009 | Page | |
| 7,873,892 B2 | 1/2011 | Ganga et al. | |
| 8,108,756 B2 | 1/2012 | Ganga et al. | |
| 8,295,312 B2 * | 10/2012 | Diab et al. | 370/519 |
| 8,307,265 B2 * | 11/2012 | Ganga et al. | 714/776 |
| 8,363,679 B2 * | 1/2013 | Sorenson et al. | 370/503 |
| 8,375,276 B2 * | 2/2013 | Geng et al. | 714/775 |
| 8,514,634 B1 * | 8/2013 | Wu | 365/189.011 |
| 2009/0276681 A1 | 11/2009 | Ou et al. | |
| 2010/0095185 A1 | 4/2010 | Ganga et al. | |
| 2010/0229067 A1 | 9/2010 | Ganga et al. | |

OTHER PUBLICATIONS

"Carrier Sense Multiple Access withCollision Detection (CSMA/CD) Access Method and Physical Layer Specifications Amendment 4: Ethernet Operation over Electrical Backplanes," IEEE-SA Standards Board, Mar. 22, 2007.
IEEE Standard 802.3-2008 section 1, Dec. 26, 2008.
IEEE Standard 802.3-2008 section 2, Dec. 26, 2008.
IEEE Standard 802.3-2008 section 3, Dec. 26, 2008.
IEEE Standard 802.3-2008 section 4, Dec. 26, 2008.
IEEE Standard 802.3-2008 section 5, Dec. 26, 2008.

* cited by examiner

*Primary Examiner* — Alex Skripnikov
(74) *Attorney, Agent, or Firm* — Alan A. R. Cooper; Frederick J. Telecky, Jr.

(57) ABSTRACT

An apparatus is provided. Physical medium dependent (PMD) sublayer logic is configured to communicate with a communications medium. Physical medium attachment (PMA) sublayer logic is coupled to the PMD logic. Forward error correction (FEC) sublayer logic is coupled to the PMA sublayer logic, and physical coding (PCS) sublayer logic is configured to communicate with an interface. A transmit path is coupled to the transmit data in a second clock domain to the FEC sublayer logic. A first read pointer circuit is coupled to transmit path. A write pointer circuit is coupled to the transmit path. A receive path is coupled to receive data in the second clock domain from the FEC sublayer logic. A second read pointer circuit is coupled to the receive path, where the first read pointer circuit, the second read pointer circuit, and the write pointer circuits are each configured to detect gaps between the first and second clock domains.

19 Claims, 9 Drawing Sheets

US 8,767,762 B2

PHYSICAL TRANSCEIVER GEARBOX

TECHNICAL FIELD

The invention relates generally to a physical transceiver (PHY) gearbox and, more particularly, to a PHY gearbox using a gapped clock.

BACKGROUND

Turning to FIG. 1, an example of a conventional system 100 can be seen. In this system 100, hosts 102-1 to 102-N (which can be; for example, a computer, router, or switch) are able to communicate with one another over communications medium 112 (which can; for example, be an optical fiber, backplane, or twisted pair) through network interfaces 104-1 to 104-N. In this example, the network interfaces 104-1 to 104-N employ Ethernet over Electrical Backplanes and, more specifically, 10 GBase-KR. A description of 10 GBase-KR can be found in the Institute of Electrical and Electronics Engineers (IEEE) standard 802.3-2008 (which is dated Dec. 26, 2008 and which is incorporated by reference herein for all purposes). These network interfaces 104-1 to 104-N employ media access control (MAC) circuits 106-1 to 106-N that communicate with PHYs 110-1 to 110-N via media independent interfaces (MIIs) 108-1 to 108-N (which can typically have half-duplex or full-duplex operation). Each of which is described in IEEE standard 802.3-2008.

Of interest here, however, are PHYs 110-1 to 110-N, and, as can be seen in greater detail in FIG. 2, PHYs 110-1 to 110-N (hereinafter PHY 110), PHY 110 employs several sublayers. This PHY 110 can be an independent integrated circuit (IC) or can be integrated with a MAC circuit (i.e., MAC circuit 106-1) and an MII 108. As shown, the PHY 110 is generally comprised of physical medium dependent (PMD) sublayer logic 212; physical medium attachment (PMA) sublayer logic 210, forward error correction (FEC) sublayer logic 204, and physical coding (PCS) sublayer logic 202. These sublayer logic circuits 202, 204, 210, and 212 interact with one another to provide communications between MII 108 and communications medium 112. For transmission, the FEC sublayer logic 204 employs an encoder 206 as described in IEEE standard 802.3-2008, clause 74, and, for reception, the FEC sublayer logic 204 employs a decoder 308 as described in IEEE standard 802.3-2008, clause 74.

As can be seen in FIG. 3, the PCS sublayer logic 202 can be a transceiver, having a PCS transmitter 302 and a PCS receiver 304. The transmitter 302, in this example, is able to receive data from MII 108, encode the data with encoder 306, scramble the encoded data with scrambler 308, and convert (so as to be used by FEC sublayer logic 204) with gearbox 310. The receiver 304, in this example, is able to convert data from FEC sublayer logic 204 using gearbox 312, descramble the data with descrambler 314, and decode the data (for use with MII 108) with decoder 316. The details of PCS sublayer logic 202 can, for example, be seen in IEEE standard 802.3-2008, clauses 48 and 74.

Looking to the gearbox 310 (an example of which can be seen in greater detail in FIG. 4); it is able to perform data conversion over different clock domains. For example, the gearbox 310 can receive input data payloads (which can, for example, be 66 bits wide) at a clock rate (e.g. 161.13 MHz) in one domain and covert the data into payloads to output data payloads (which can, for example, be 16 bits wide) at another clock rate (e.g., 644.53 MHz), in another clock domain. To do this, input data DATAIN is provided to multiplexers 404-1 and 404-2 (which, as shown, are controlled by write pointer 402). This allows the input data DATAIN to be input into first-in-first-out memory (FIFO) 406 (which, typically, has two halves that can each be 66 bits wide). The read pointer 408 and comparison circuit 410 (which is typically a read/write pointer comparison circuit) then can allow the data output DATAOUT to be read out of the FIFO 406 at the clock rate (e.g., 644.53 MHz) of the output domain. Usually the clock signals for each of the domains (i.e., two as shown) are synchronized, but a "stall" is generally needed after a set number of cycles (e.g., 33 cycles) to preserve synchronization.

Gearbox 312 (an example of which can be seen in FIG. 5) performs an analogous function to that of gearbox 310. For example, the gearbox 312 can receive input data payloads (which can, for example, be 16 bits wide) at a clock rate (e.g. 644.53 MHz) in one domain and covert the data into payloads to output data payloads (which can, for example, be 66 bits wide) at another clock rate, (e.g., 161.13 MHz) in another clock domain. This is generally accomplished by the reception of input data DATAIN by the write pointer 502. This input data DATAIN can be written to FIFO 504 (which is, typically, similar in construction to FIFO 406) with the assistance of comparison circuit 510 (which is typically a read/write pointer comparison circuit). The output data DATAOUT can then be read out from FIFO 504 through multiplexer 506 (which is generally controlled by the read pointer 508). With this arrangement, however, clock signals from the domains (i.e., two as shown) are not synchronous.

With each of these gearboxes 310 and 312, there are several problems. Because of the different time domains, timing is particularly complex. Also, largely because of the different time domains, complex read/write pointer circuitry is usually required. Therefore, there is a need for PCS sublayer logic with improved gearboxes.

Some examples of conventional systems are: U.S. Pat. Nos. 7,499,500; 7,873,892; 8,108,756; U.S. Patent Pre-Grant Publ. No. 2009/0276681; U.S. Patent Pre-Grant Publ. No. 2010/0095185; U.S. Patent Pre-Grant Publ. No. 2010/0229067; and "IEEE Standard 802.3ap-2007: Carrier Sense Multiple Access with Collision Detection (CSMA/CD) Access Method and Physical Layer Specifications, Amendment 4: Ethernet Operation over Electrical Backplanes," *IEEE-SA Standards Board*, Mar. 22, 2007; and IEEE Standard 802.3-2008 sections 1-5, Dec. 26, 2008 (which has been incorporated by reference above).

SUMMARY

In accordance with the present invention, an apparatus is provided. The apparatus comprises physical medium dependent (PMD) sublayer logic that is configured to communicate with a communications medium; physical medium attachment (PMA) sublayer logic that is coupled to the PMD logic; forward error correction (FEC) sublayer logic that is coupled to the PMA sublayer logic; and physical coding (PCS) sublayer logic that is configured to communicate with an interface, wherein the PCS sublayer logic includes gearbox circuitry having: a transmit path that is configured to receive data in a first clock domain and that is coupled to transmit data in a second clock domain to the FEC sublayer logic; a first read pointer circuit that is coupled to transmit path; a write pointer circuit that is coupled to the transmit path; a receive path that is coupled to receive data in the second clock domain from the FEC sublayer logic and that is configured to output data in the first clock domain; and a second read pointer circuit that is coupled to the receive path, wherein the first read pointer circuit, the second read pointer circuit, and the write pointer circuits are each configured to detect gaps between the first and second clock domains.

In accordance with the present invention, the PCS sublayer logic further comprises: a PCS transmitter that is configured to communicate with the interface and that is coupled to the FEC sublayer logic; and a PCS transmitter that is configured to communicate with the interface and that is coupled to the FEC sublayer logic.

In accordance with the present invention, the gearbox circuitry further comprises a transmit gear box that includes the transmit path, the first read pointer circuit, and the write pointer circuit and a receive gearbox that includes the receive path and the second read pointer circuit.

In accordance with the present invention, the PCS transmitter further comprises: an encoder that is configured to communicate with the interface; and a scrambler that is coupled to the encoder and transmit gearbox.

In accordance with the present invention, the PCS receiver further comprises: a decoder that is configured to communicate with the interface; and a descrambler that is coupled to the encoder and receive gearbox.

In accordance with the present invention, each of the first read pointer circuits, second read pointer circuits, and the write pointer circuits further comprises: a first flip-flop that is configured to receive a first clock signal in the first clock domain; a second flip-flop that is coupled to the first flip-flop and that is configured to receive a second clock signal in the second clock domain; a logic gate that is coupled to the first and second flip-flops; a multiplexer that is coupled to the logic gate; a register that is coupled to the multiplexer; and an incrementer that is coupled to the register and the multiplexer.

In accordance with the present invention, the multiplexer further comprises a first multiplexer, and wherein the transmit gearbox further comprises: a write matrix that is coupled to a scrambler; a second multiplexer that is coupled to the write matrix and the write pointer circuit; a first buffer that is coupled to the first multiplexer; a third multiplexer that is coupled to the buffer and the first read pointer circuit; and a second buffer that is coupled to the third multiplexer.

In accordance with the present invention, the receive gearbox further comprises: a third buffer that is coupled to the FEC sublayer logic; and a fourth multiplexer that is coupled to the third buffer, the second read pointer circuit, and the descrambler.

In accordance with the present invention, the first and second flip-flops further comprises first and second D flip-flops, and wherein the logic gate further comprises an XOR gate.

In accordance with the present invention, an apparatus is provided. The apparatus comprises a communications medium; a plurality of network interfaces, wherein each network interface includes: a media access control (MAC) circuit; a media independent interface (MII) that is coupled to the MAC circuit; and a physical transceiver (PHY) having: PMD sublayer logic that is coupled to the MII; PMA sublayer logic that is coupled to the PMD logic; FEC sublayer logic that is coupled to the PMA sublayer logic; and PCS sublayer logic that is configured to communicate with an interface, wherein the PCS sublayer logic includes gearbox circuitry having: a transmit path that is configured to receive data in a first clock domain and that is coupled to transmit data in a second clock domain to the FEC sublayer logic; a first read pointer circuit that is coupled to transmit path; a write pointer circuit that is coupled to the transmit path; a receive path that is coupled to receive data in the second clock domain from the FEC sublayer logic and that is configured to output data in the first clock domain; and a second read pointer circuit that is coupled to the receive path, wherein the first read pointer circuit, the second read pointer circuit, and the write pointer circuits are each configured to detect gaps between the first and second clock domains.

In accordance with the present invention, the apparatus further comprises a plurality of hosts, wherein each host is coupled to at least one of the MAC circuits

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
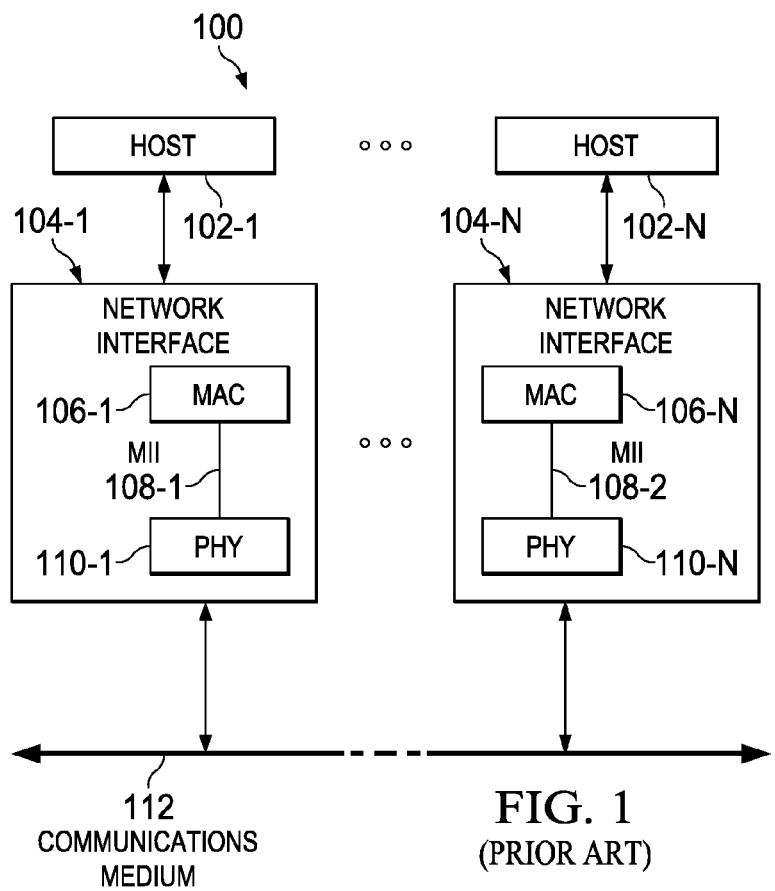
FIG. 1 is a diagram of an example of a conventional system.
Figure 2:
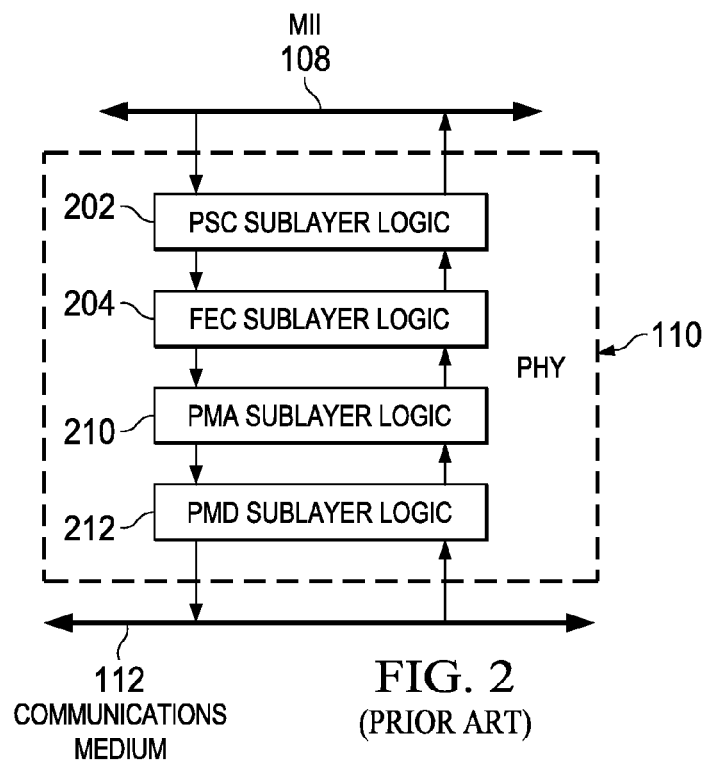
FIG. 2 is a diagram of an example of a PHY of FIG. 1.
Figure 3:
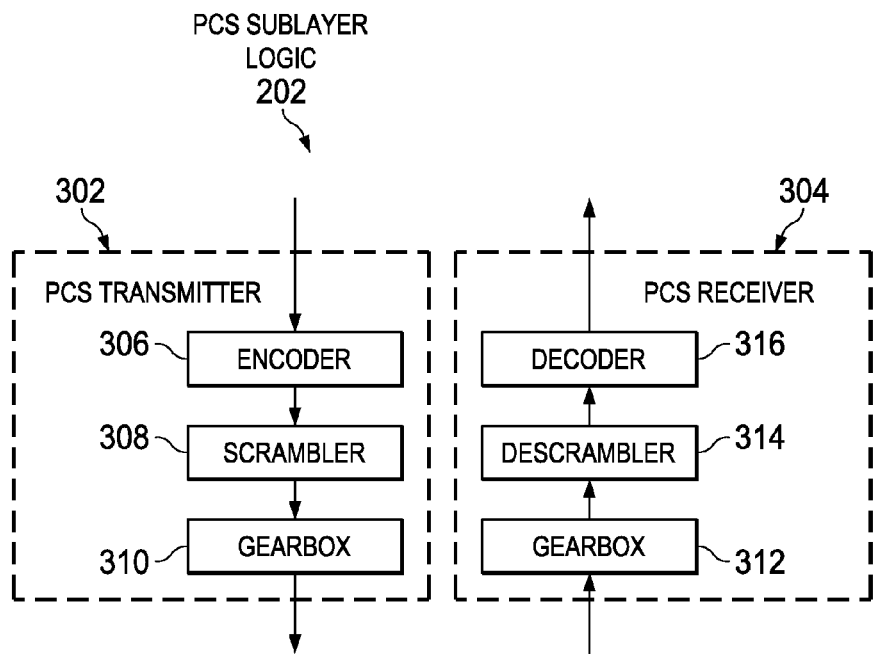
FIG. 3 is a diagram of a PCS sublayer logic of FIG. 2.
Figure 4:
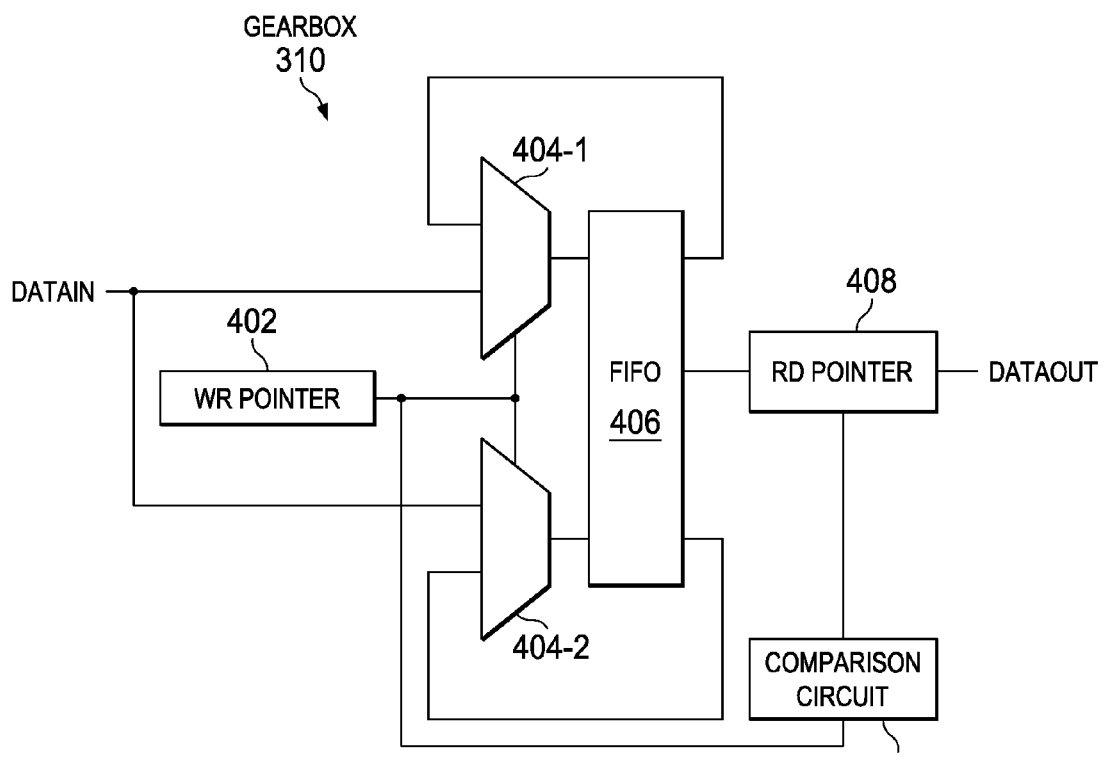
FIGS. 4 and 5 are diagrams of the gearboxes of FIG. 3.
Figure 5:
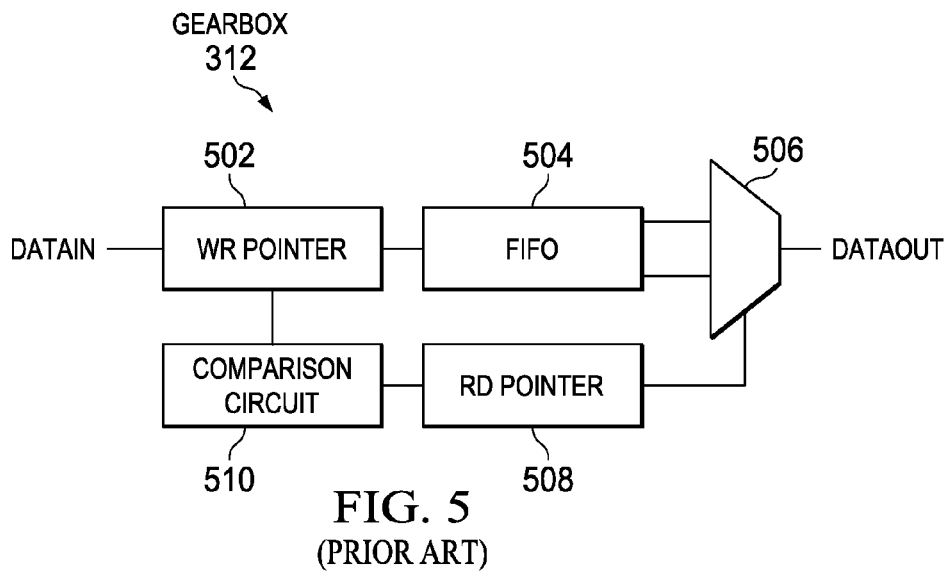

Refer now to the drawings wherein depicted elements are, for the sake of clarity, not necessarily shown to scale and wherein like or similar elements are designated by the same reference numeral through the several views.

Figure 6:
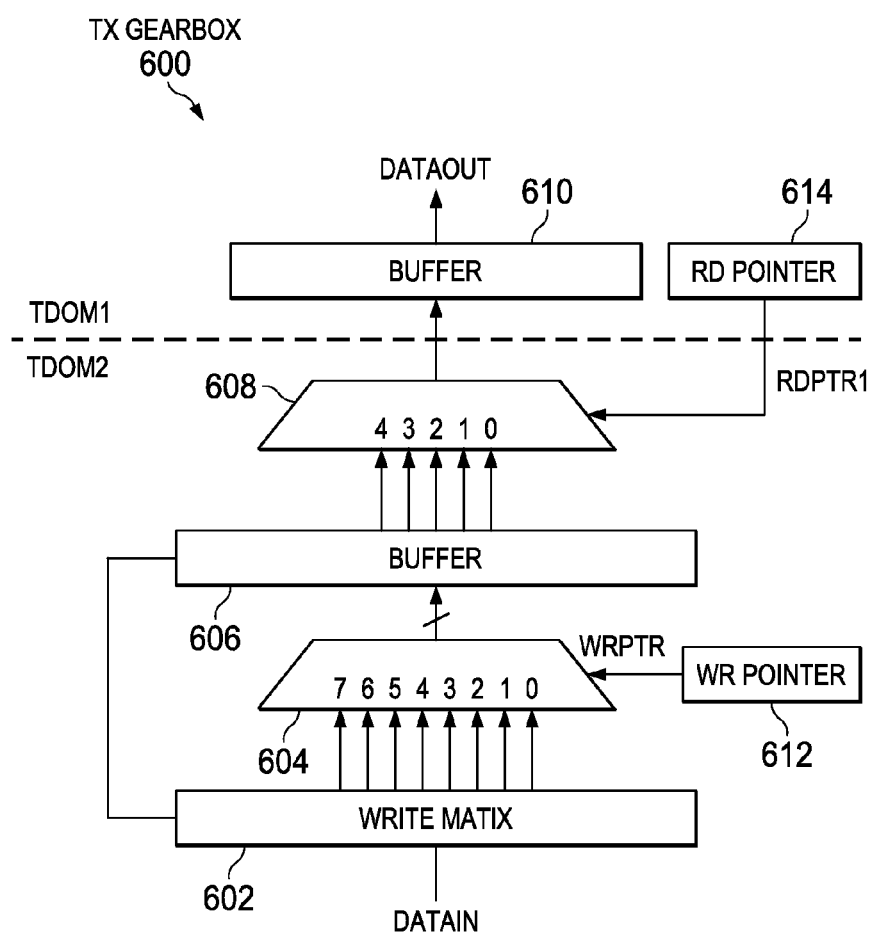
FIG. 6 is a diagram of an example of a transmission gearbox in accordance with the present invention.

Turning to FIG. 6, an example of a transmission of TX gearbox 600 in accordance with the present invention can be seen. Gearbox 600 has similar overall functionality to gearbox 310, but has less complexity. Typically, the gearbox 600 comprises a transmit path, a read pointer 614, and a write pointer 612. As shown, write matrix 602 of gearbox 600 is able to receive feedback (e.g., 16 bits) from buffer 606 in conjunction with input data DATAIN (which can for example be a 66-bit payload). The multiplexer 604 (which, as shown is controlled by the write pointer 612) is able to output data from the write matrix 602 to the buffer 606 over a bus (which typically has a width equal to that of the buffer 606). For example, the buffer 606 and bus can be 80-bits wide, meaning that the write matrix 602 can provide 80 bits to each of the input channels of the multiplexer 604. As shown, the buffer 606 is substantially less complex than FIFO 406. The write pointer 612 (which generally operates in both clock domains TDOM1 and TDOM2 and which is discussed in detail below) can, for example, provide a write pointer signal WRPTR (which can, for example, be 3 bits) to control multiplexer 604. The multiplexer 608 can then read data from buffer 606 based on the state of the read pointer signal RDPTR1 (which can, for example, be 3 bits) from the read pointer 614 (which typically operates in both domains TDOM1 and TDOM2 and which is described in greater detail below). As shown in this example, each of the 5 channels or busses between the buffer 606 and multiplexer 608 is 16 bits wide, meaning that, in this example the multiplexer 608 is able to output data to buffer 610 (which, itself, may be 16 bits wide) over a 16 bit bus. This arrangement allows the output data DATAOUT to be output at the rate (e.g., about 644.53 MHz) of domain TDOM1.

With respect to the domains TDOM1 and TDOM2, there is usually a relationship between the respective clock signals CLK1 and CLK2. Clock signal CLK2 can, and usually is, synchronous to and derived from clock signal CLK1. Typically, clock signal CLK1 can be divided to generate clock signal CLK2, and it is usually divided in a manner to generate a "gap" or shift in frequency. For example, if clock signal CLK1 is assumed to have a frequency of about 644.53 MHz, 7 out of 8 clock cycles can be divided by 4, while the $8^{th}$ cycle is divided by 5. For this example, clock signal CLK2 would have a frequency of approximately 161 Mhz (for 7 cycles) and approximately 129 MHz (for this $8^{th}$ cycle), resulting in an average frequency of about 156.25 MHz. It is this shift in frequency at the $8^{th}$ cycle in this example that would correspond to a "gap."

Figure 7:
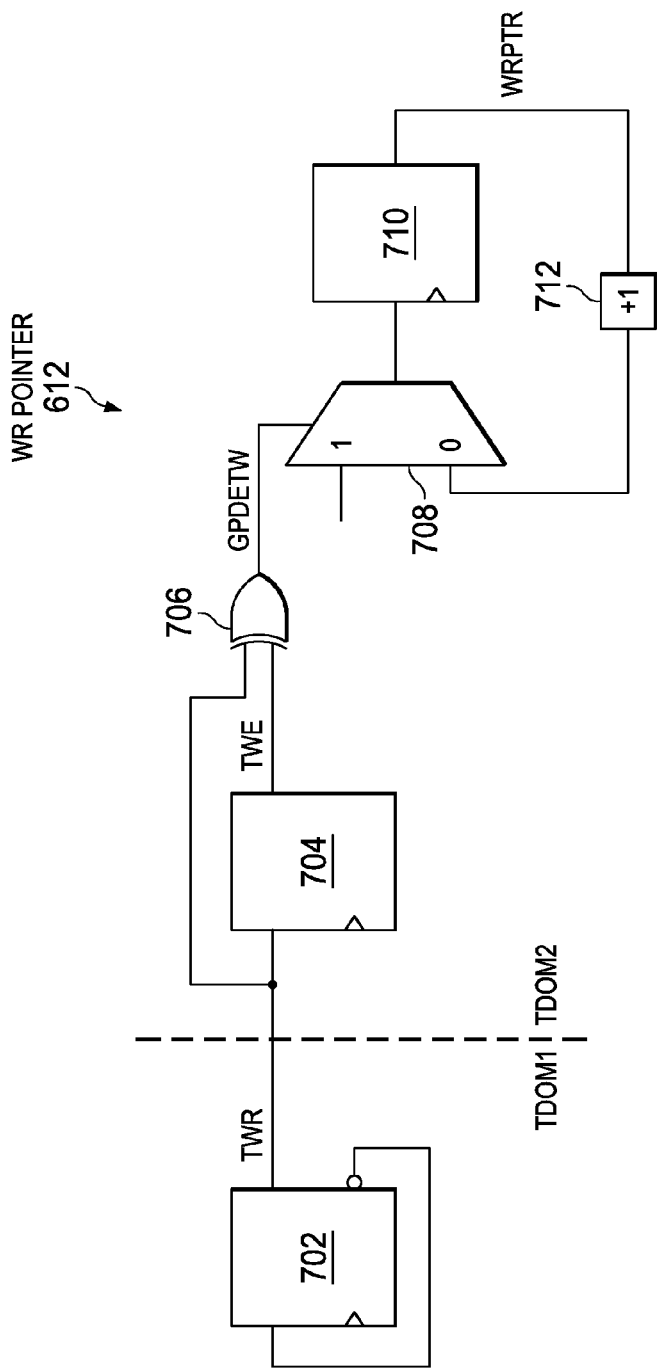
FIG. 7 is a diagram of an example of a write pointer of FIG. 6.
Figure 8:
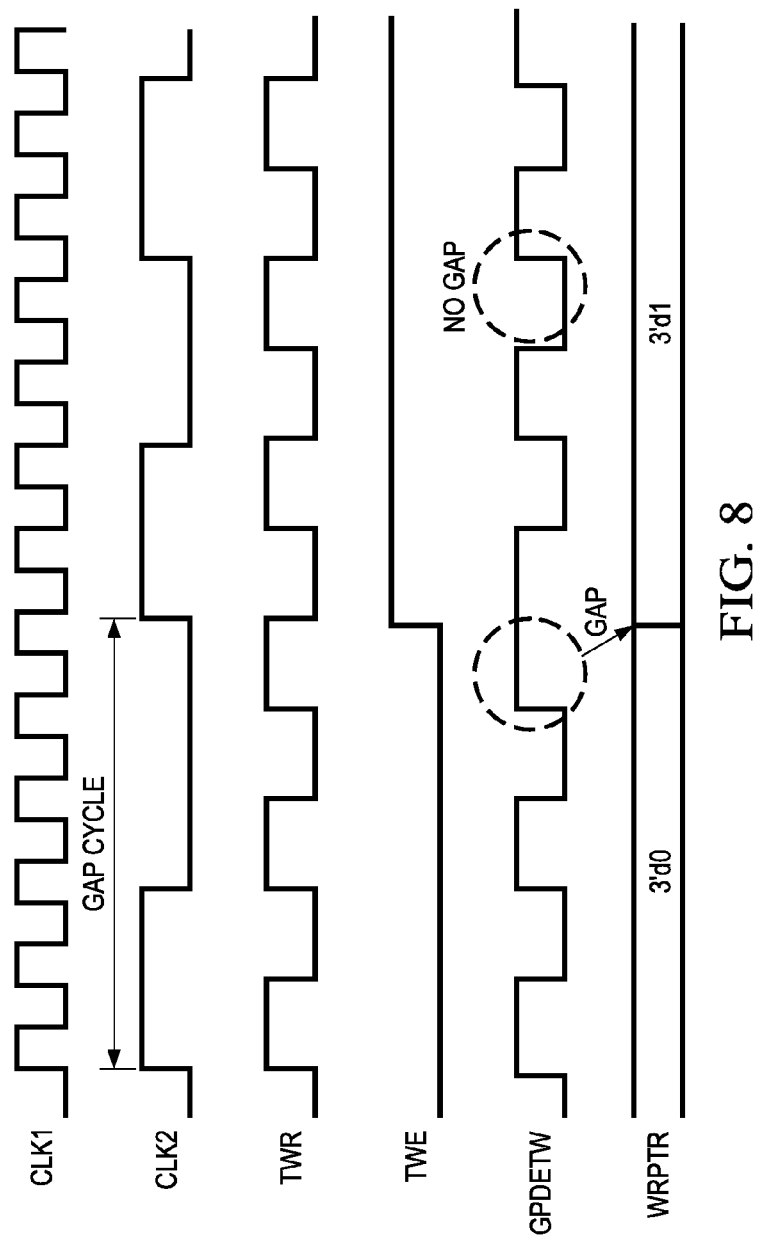
FIG. 8 is a timing diagram depicting an example operation of the write pointer of FIG. 7.

Turning to FIGS. 7 and 8, an example of the write pointer 612 can be seen in greater detail. In this example, flip-flop 702 (which can be a D-type flip-flop) toggles based on the clock signal CLK1 of domain TDOM1 (which can have a frequency of about 644.53 MHz) to generate toggle signal TWR. Flip-flop 704 (which can be a D-type flip-flop) receives this toggle signal TWR and is clocked by clock signal CLK2 of domain TDOM2 (which can have a frequency of about 156.25 MHz). As shown in FIG. 8, the output of XOR gate 706 (which outputs a gap detect signal GPDETW) is in synchronization with toggle signal TWR so as to allow the value in register 710 (which is clocked by clock signal CLK2 and with outputs the write pointer signal WRPRT) to be incremented by incrementer 712 and multiplexer 708. Usually, however, at regular intervals, a gap or stall cycle is introduced with clock signal CLK2 so as to preserve synchronization. During one of these gap cycles (an example of which can be seen in FIG. 8), the gap detect signal GPDETW reflects this. As a result the gearbox 600 can function with little to no disruption and with a relatively simple write pointer 612.

Figure 9:
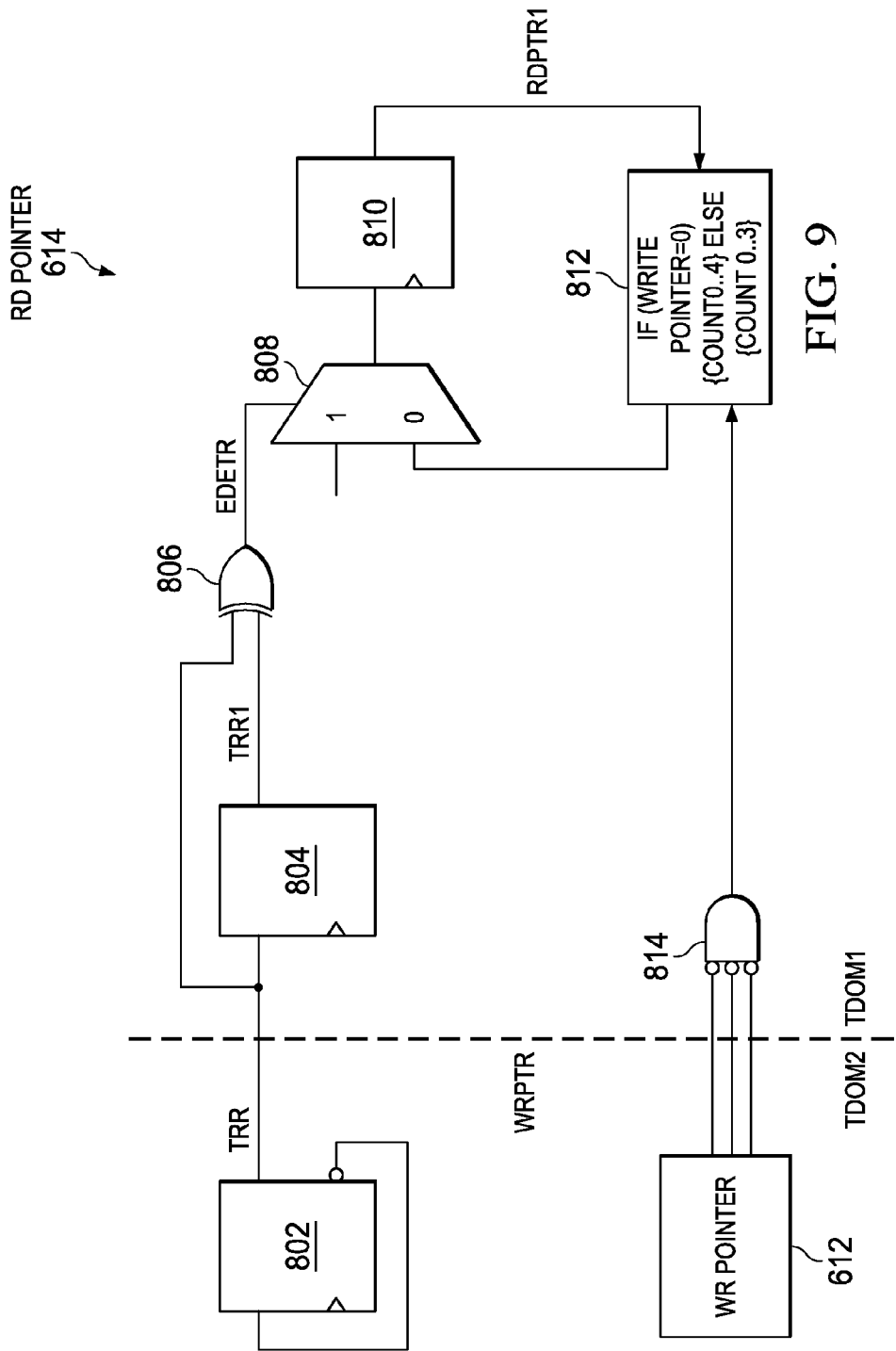
FIG. 9 is a diagram of an example of a read pointer of FIG. 6.
Figure 10:
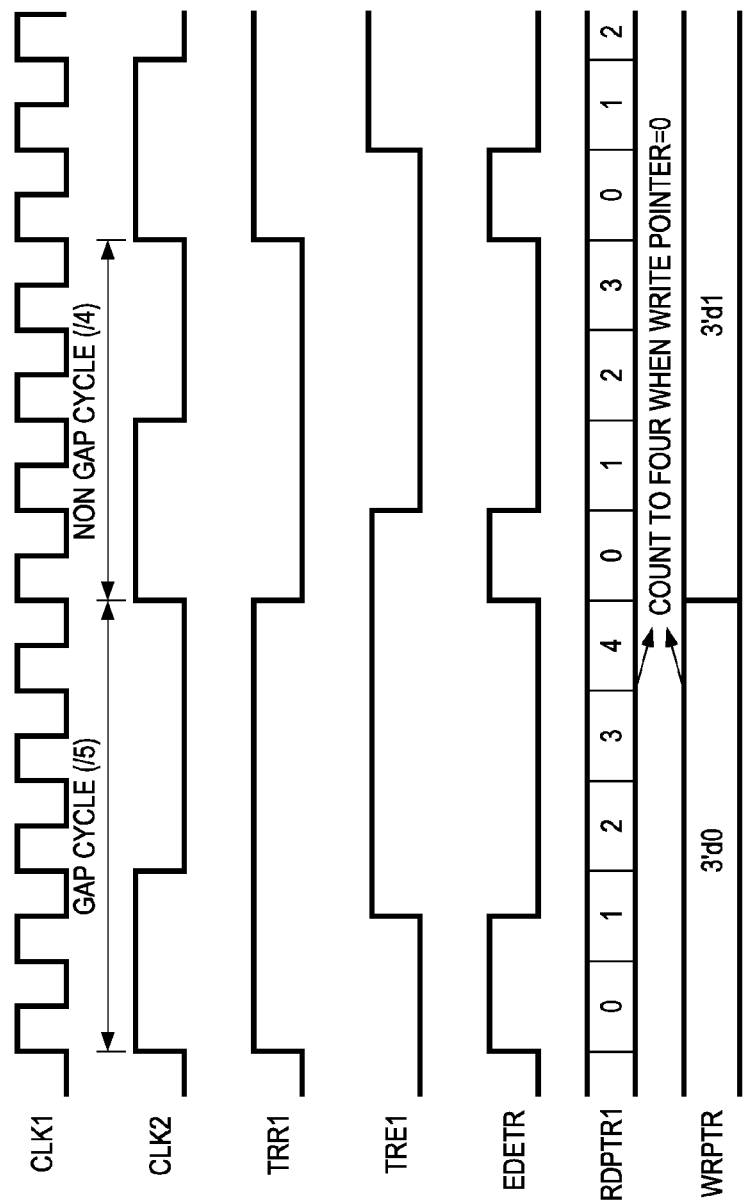
FIG. 10 is a timing diagram depicting an example operation of the read pointer of FIG. 9.

Similarly, with read pointer 614, an example can be seen in FIGS. 9 and 10. In this example, flip-flop 802 (which can be a D-type flip-flop) toggles based on the clock signal CLK2 of domain TDOM2 to generate toggle signal TRR1. Flip-flop 804 (which can be a D-type flip-flop) receives this toggle signal TRR1 and is clocked by clock signal CLK1 of domain TDOM1. As shown in FIG. 10, the output of XOR gate 806 (which outputs an edge detect signal EDETR) detects each edge of toggle signal TRR1 so as to allow the value in register 810 (which is clocked by clock signal CLK1 and which outputs the read pointer signal RDPTR1) to be incremented by incrementer 812 and multiplexer 808. As described above, at regular intervals, a gap or stall cycle is introduced with clock signal CLK2 so as to preserve synchronization. During one of these gap cycles (an example of which can be seen in FIG. 10), the write pointer signal WRPTR reflects the gap cycle, and AND gate 814 allows incrementer 812 to allow for an additional increment to accommodate for the gap cycle.

Figure 11:
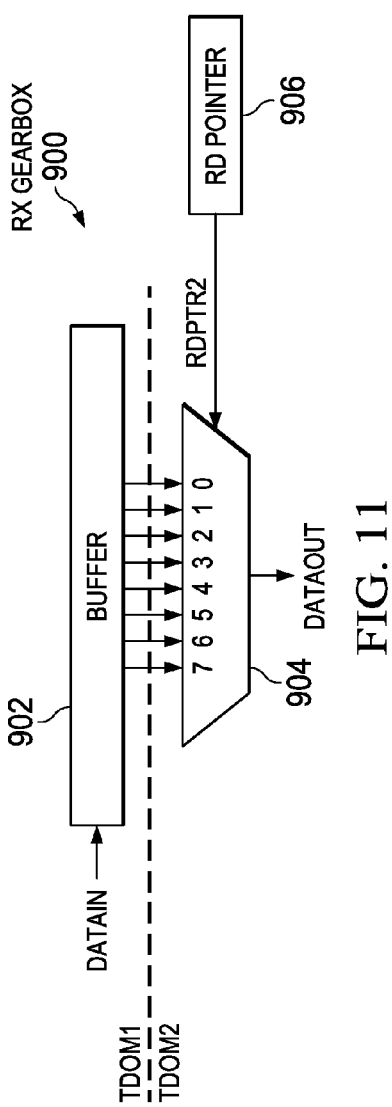
FIG. 11 is a diagram of an example of a receive gearbox in accordance with the present invention.

Turning now to FIG. 11, an example of a receive or RX gearbox 900 in accordance with the present invention can be seen. Gearbox 900 has a similar overall functionality to gearbox 312, but (as with gearbox 600) has less complexity. Typically, gearbox 900 comprises a receive path and read pointer 906. As shown, input data DATAIN (which can be 16 bit payloads) can be shifted (operating like a shift register) into buffer 902 using clock signal CLK1 in domain TDOM1 (which can have a frequency of about 644.53 MHz). The buffer 902 can, for example, be 80 bits wide. Output data DATAOUT (which can, for example, be 66 bit payloads) can then be read out of the buffer 902 in domain TDOM2 (which can be about 156.25 MHz) using multiplexer 904. As shown in this example, there are eight 16-bit channels or busses that are coupled between the multiplexer 904 and buffer 902. This multiplexer is then controlled by the read pointer signal RDPTR2 (which can, for example, be 3 bits) from read pointer 906.

As an example of the operation of gearbox 900, the gap cycle can reset signal RDPTR2 to a value of "1" (meaning that so that the value of signal RDPTR2 is "0" during the gap when 80 bits are loaded into buffer 902). Because, in this example, 66 bits are read out, there is a reserve of 14 bits (achieving a total of 80 bits). As signal RDPTR2 increments from a value of "1" to a value of "7," 64 bits of data are loaded into buffer 902, while 66 bits of data are read out. This diminishes the original 14 bits of reserve by 2 bits with each increment. The read position in this example is also shifted over by 2 bits with each increment. After signal RDPTR2 reaches a value of "7," there is no more reserve bits, and the gap cycle follows, which allows for the replenishment of buffer 902.

Figure 12:
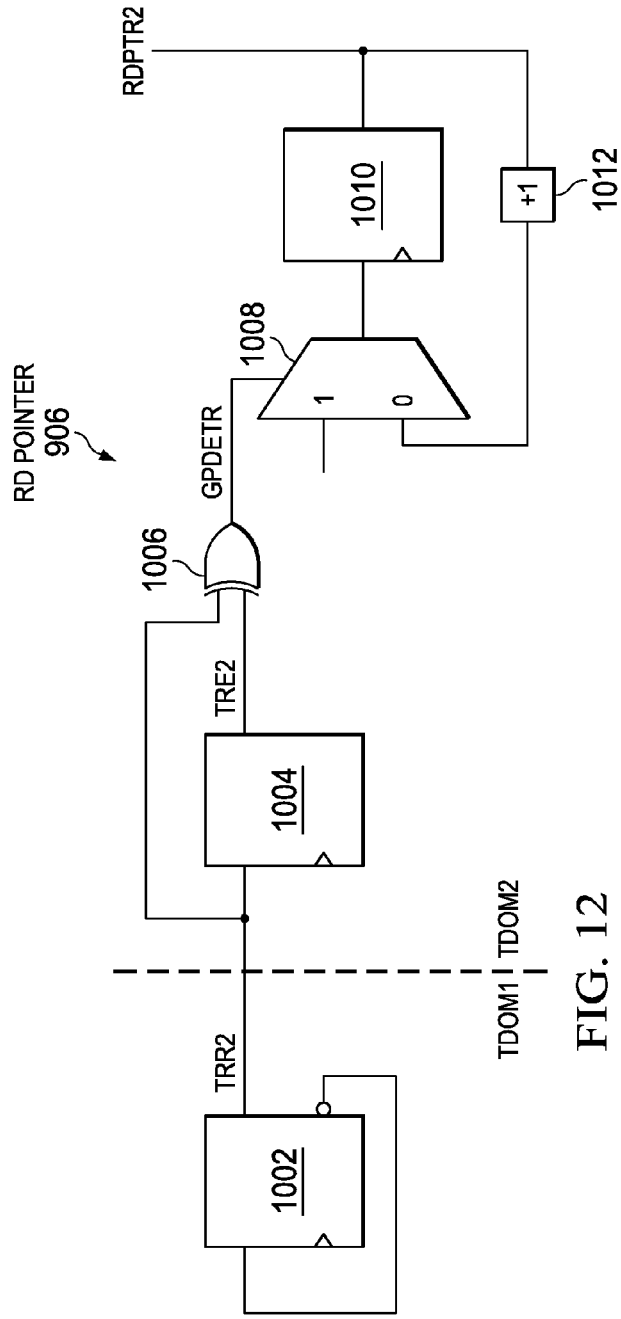
FIG. 12 is a diagram of an example of a read pointer of FIG. 11.
Figure 13:
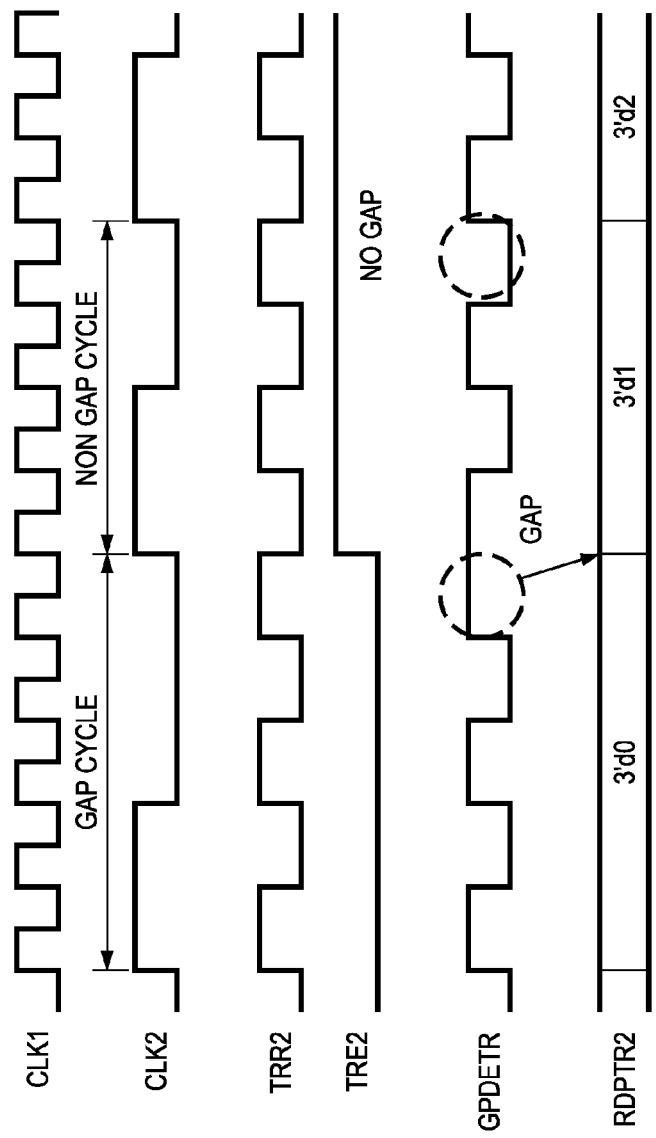
FIG. 13 is a timing diagram depicting an example operation of the read pointer of FIG. 12.

The read pointer 906 (an example of which can be seen in FIGS. 12 and 13) is similar in construction and operation to that of write pointer 612. As shown, flip-flop 1002 (which can be a D-type flip-flop) toggles based on the clock signal CLK1 of domain TDOM1 (which can have a frequency of about 644.53 MHz) to generate toggle signal TRR2. Flip-flop 1004 (which can be a D-type flip-flop) receives this toggle signal TRR2 and is clocked by clock signal CLK2 of domain TDOM2 (which can have a frequency of about 156.25 MHz). As shown in FIG. 13, the output of XOR gate 1006 (which outputs a gap detect signal GPDETR) is in synchronization with toggle signal TRR2 so as to allow the value in register 1010 (which is clocked by clock signal CLK2 and with outputs the write pointer signal WRPRT) to be incremented by incrementer 1012 and multiplexer 1008. Usually, however, at regular intervals, a gap or stall cycle is introduced with clock signal CLK2 so as to preserve synchronization. During one of these gap cycles (an example of which can be seen in FIG. 8), the gap detect signal GPDETW reflects this.

As a result of using these configurations, several advantages can be realized. First, the buffers (e.g., 902) are simpler than the FIFO (e.g., 406) employed in conventional systems. Second, there is also no need to a stall mechanism as the pointer alignment is self-recovering. Third, the read/write pointer circuit is simpler than in conventional systems.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
 physical medium dependent (PMD) sublayer logic that is configured to communicate with a communications medium;
 physical medium attachment (PMA) sublayer logic that is coupled to the PMD logic;
 forward error correction (FEC) sublayer logic that is coupled to the PMA sublayer logic; and physical coding (PCS) sublayer logic that is configured to communicate with an interface, wherein the PCS sublayer logic includes gearbox circuitry having:
  a transmit path that is configured to receive data in a first clock domain and that is coupled to transmit data in a second clock domain to the FEC sublayer logic;
  a first read pointer circuit that is coupled to the transmit path;
  a write pointer circuit that is coupled to the transmit path;
  a receive path that is coupled to receive data in the second clock domain from the FEC sublayer logic and that is configured to output data in the first clock domain; and
  a second read pointer circuit that is coupled to the receive path, wherein the first read pointer circuit, the second read pointer circuit, and the write pointer circuits are each configured to detect gaps between the first and second clock domains.

2. The apparatus of claim 1, wherein the PCS sublayer logic further comprises:
  a PCS transmitter that is configured to communicate with the interface and that is coupled to the FEC sublayer logic; and
  a PCS receiver that is configured to communicate with the interface and that is coupled to the FEC sublayer logic.

3. The apparatus of claim 2, wherein the gearbox circuitry further comprises a transmit gear box that includes the transmit path, the first read pointer circuit, and the write pointer circuit and a receive gearbox that includes the receive path and the second read pointer circuit.

4. The apparatus of claim 3, wherein the PCS transmitter further comprises:
  an encoder that is configured to communicate with the interface; and
  a scrambler that is coupled to the encoder and the transmit gearbox.

5. The apparatus of claim 4, wherein the PCS receiver further comprises:
  a decoder that is configured to communicate with the interface; and
  a descrambler that is coupled to the encoder and the receive gearbox.

6. The apparatus of claim 5, wherein each of the first read pointer circuits, second read pointer circuits, and the write pointer circuits further comprises:
  a first flip-flop that is configured to receive a first clock signal in the first clock domain;
  a second flip-flop that is coupled to the first flip-flop and that is configured to receive a second clock signal in the second clock domain;
  a logic gate that is coupled to the first and second flip-flops;
  a multiplexer that is coupled to the logic gate;
  a register that is coupled to the multiplexer; and
  an incrementer that is coupled to the register and the multiplexer.

7. The apparatus of claim 6, wherein the multiplexer further comprises a first multiplexer, and wherein the transmit gearbox further comprises:
  a write matrix that is coupled to a scrambler;
  a second multiplexer that is coupled to the write matrix and the write pointer circuit;
  a first buffer that is coupled to the first multiplexer;
  a third multiplexer that is coupled to the buffer and the first read pointer circuit; and
  a second buffer that is coupled to the third multiplexer.

8. The apparatus of claim 7, wherein the receive gearbox further comprises:
  a third buffer that is coupled to the FEC sublayer logic; and
  a fourth multiplexer that is coupled to the third buffer, the second read pointer circuit, and the descrambler.

9. The apparatus of claim 8, wherein the first and second flip-flops further comprises first and second D flip-flops, and wherein the logic gate further comprises an XOR gate.

10. An apparatus comprising:
  a communications medium;
  a plurality of network interfaces, wherein each network interface includes:
    a media access control (MAC) circuit;
    a media independent interface (MII) that is coupled to the MAC circuit; and
    a physical transceiver (PHY) having:
      PMD sublayer logic that is coupled to the MII;
      PMA sublayer logic that is coupled to the PMD logic;
      FEC sublayer logic that is coupled to the PMA sublayer logic; and
      PCS sublayer logic that is configured to communicate with an interface, wherein the PCS sublayer logic includes gearbox circuitry having:
        a transmit path that is configured to receive data in a first clock domain and that is coupled to transmit data in a second clock domain to the FEC sublayer logic;
        a first read pointer circuit that is coupled to the transmit path;
        a write pointer circuit that is coupled to the transmit path;
        a receive path that is coupled to receive data in the second clock domain from the FEC sublayer logic and that is configured to output data in the first clock domain; and
        a second read pointer circuit that is coupled to the receive path, wherein the first read pointer circuit, the second read pointer circuit, and the write pointer circuits are each configured to detect gaps between the first and second clock domains.

11. The apparatus of claim 10, wherein the PCS sublayer logic further comprises:
  a PCS transmitter that is coupled to the FEC sublayer logic and the MII; and
  a PCS receiver that is coupled to the FEC sublayer logic and the MII.

12. The apparatus of claim 11, wherein the gearbox circuitry further comprises a transmit gear box that includes the transmit path, the first read pointer circuit, and the write pointer circuit and a receive gearbox that includes the receive path and the second read pointer circuit.

13. The apparatus of claim 12, wherein the PCS transmitter further comprises:
  an encoder that is configured to communicate with the interface; and
  a scrambler that is coupled to the encoder and the transmit gearbox.

14. The apparatus of claim 13, wherein the PCS receiver further comprises:
  a decoder that is configured to communicate with the interface; and
  a descrambler that is coupled to the encoder and the receive gearbox.

15. The apparatus of claim 14, wherein each of the first read pointer circuits, second read pointer circuits, and the write pointer circuits further comprises:
  a first flip-flop that is configured to receive a first clock signal in the first clock domain;

a second flip-flop that is coupled to the first flip-flop and that is configured to receive a second clock signal in the second clock domain;

a logic gate that is coupled to the first and second flip-flops;

a multiplexer that is coupled to the logic gate;

a register that is coupled to the multiplexer; and an incrementer that is coupled to the register and the multiplexer.

16. The apparatus of claim 15, wherein the multiplexer further comprises a first multiplexer, and wherein the transmit gearbox further comprises:

a write matrix that is coupled to a scrambler;

a second multiplexer that is coupled to the write matrix and the write pointer circuit;

a first buffer that is coupled to the first multiplexer;

a third multiplexer that is coupled to the buffer and the first read pointer circuit; and a second buffer that is coupled to the third multiplexer.

17. The apparatus of claim 16, wherein the receive gearbox further comprises:

a third buffer that is coupled to the FEC sublayer logic; and a fourth multiplexer that is coupled to the third buffer, the second read pointer circuit, and the descrambler.

18. The apparatus of claim 17, wherein the first and second flip-flops further comprises first and second D flip-flops, and wherein the logic gate further comprises an XOR gate.

19. The apparatus of claim 18, wherein the apparatus further comprises a plurality of hosts, wherein each host is coupled to at least one of the MAC circuits.

\* \* \* \* \*